United States Patent [19]
DeFreitas

[11] 4,009,475
[45] Feb. 22, 1977

[54] DELTA-SIGMA CONVERTER AND DECODER

[75] Inventor: Richard E. DeFreitas, Westford, Mass.

[73] Assignee: Hybrid Systems Corporation, Burlington, Mass.

[22] Filed: Dec. 5, 1974

[21] Appl. No.: 529,639

[52] U.S. Cl. ............... 340/347 AD; 340/347 NT; 325/38 R; 340/347 DA
[51] Int. Cl.² ........................... H03K 13/20
[58] Field of Search ............ 340/347 AD, 347 NT, 340/347 DA; 235/183; 325/38 R

[56] References Cited
UNITED STATES PATENTS

| | | | |
|---|---|---|---|
| 3,351,932 | 11/1967 | Hibbits et al. | 340/347 |
| 3,678,500 | 7/1972 | Bauer | 340/347 AD |
| 3,810,151 | 5/1974 | Johnston et al. | 340/347 AD |
| 3,820,109 | 6/1974 | Konrad et al. | 340/347 NT |

OTHER PUBLICATIONS

Taylor, "A Current-to-Frequency Converter for Astronomical Photometry," Review of Scientific Instruments, vol. 40, No. 5, Apr. 1969, pp. 559-562.

Primary Examiner—Charles D. Miller
Attorney, Agent, or Firm—Weingarten, Maxham & Schurgin

[57] ABSTRACT

A delta-sigma converter and corresponding decoder employing predetermined characteristics of readily available logic elements. The converter is realized through the use of an integrator responding to an analog input signal and a dual D flip-flop package having a high impedance, comparator functioning input and low impedance output to act as a switch to control the integrator. Switching of the flip-flop acts to provide pulses at a rate corresponding to the analog input signal level.

7 Claims, 3 Drawing Figures

DELTA-SIGMA CONVERTER AND DECODER

FIELD OF THE INVENTION

The present invention relates to analog-to-digital converters and in particular to a delta-sigma converter for transforming analog signal level into pulse rate.

BACKGROUND OF THE INVENTION

The function of a delta-sigma converter as it is known in the art is to accept an analog signal and produce an output pulse sequence at a pulse rate, or having a number of pulses within an interval, representative of the level of the analog signal input. A system for providing this function is described in R. DeFreitas, "The Low-cost Way to Send Digital Data," Electronic Design, 2, Jan. 18, 1974. It employs an analog integrator responsive to the output signal level and is controlled between directions of integration by a comparator and flip-flop coupled to an analog switch. The comparator causes the integrator output to oscillate about a predetermined reference level by switching the direction of integration at a rate corresponding to the integration slope and thus corresponding to the input signal level. The switching results in the generation of an output pulse. In this manner, a series of output pulses are provided which represent in frequency of occurrence, the analog input signal level.

BRIEF SUMMARY OF THE INVENTION

The present invention has as its primary object the realization of a delta-sigma conversion function using greater efficiency of components. The circuit is constructed using only two separate integrated circuit modules which comprise the integrator and a logic circuit composed of a dual D flip-flop configuration with high impedance C-MOS inputs and low impedance outputs to provide a switching function. It has been found that the selection of a specific type of flip-flop package in combination with an integrator circuit, and having a specific circuit interconnection, provides the entire delta-sigma converter function. The resulting manufacturing efficiency provides a very accurate, economical converter.

A similar combination of elements in a different interconnection is used for decoding the pulse rate into a corresponding analog signal level, thus achieving the total function of conversion and decoding from combinations of only two available circuit packages.

BRIEF DESCRIPTION OF THE DRAWINGS

These and other characteristics of the present invention are more fully described below in the detailed description of the preferred embodiment, presented for purposes of illustration and not by way of limitation, and in the accompanying drawing of which.

DETAILED DESCRIPTION OF THE PREFERRED EMBODIMENT

Figure 1:
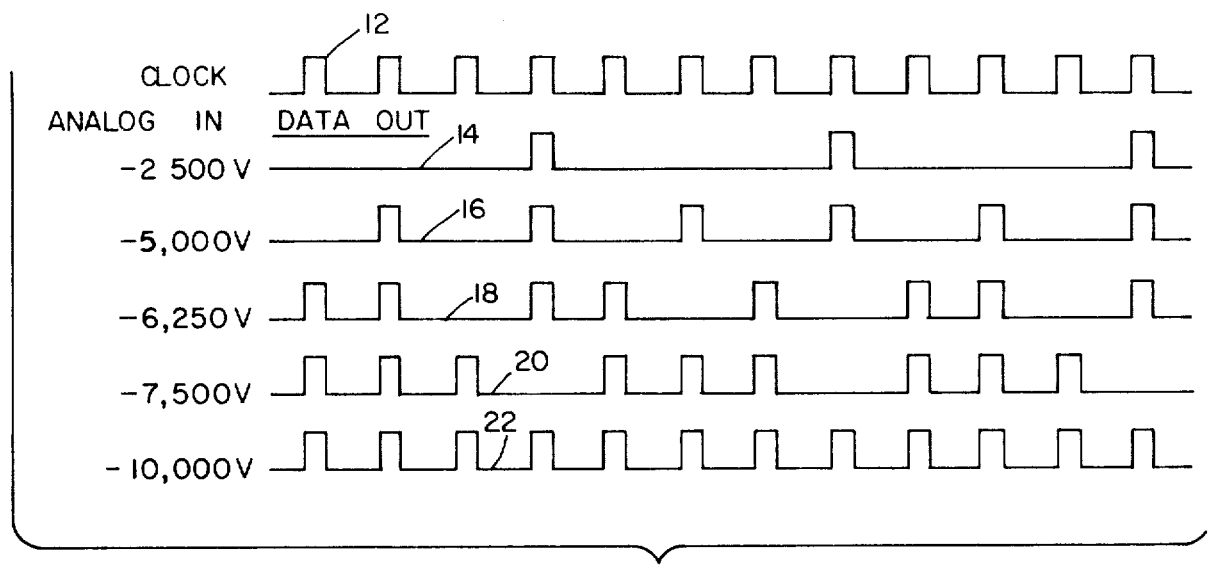
FIG. 1 is a waveform diagram useful in illustrating the function of the invention.

The present invention contemplates an improved analog-to-digital converter system which provides conversion between an analog signal input and a corresponding pulse rate with the pulses used for communication across transmission lines. Such a function can be visualized by reference to FIG. 1, wherein a waveform 12 represents a clock signal of periodic pulses at a predetermined rate. For a low voltage input signal, such as represented by a −2.5 volt input, a waveform 14 of relatively few pulses is shown, each pulse corresponding to one pulse in the clock waveform 12. At the −5.0 volt level, twice as many of the clock pulses appear as shown in the waveform 16. At increasingly higher negative analog signal levels, such as represented by the 6.25, 7.5 and 10 volt negative levels, higher pulse rates are shown in corresponding waveforms 18, 20 and 22 with greater numbers of the pulses from the clock waveform 12 provided in each of the output waveforms. In order to visualize the complementary decoder function, one simply needs to visualize the conversion of the waveforms 14–22 to corresponding analog signal voltage levels as shown in FIG. 1.

Figure 2:
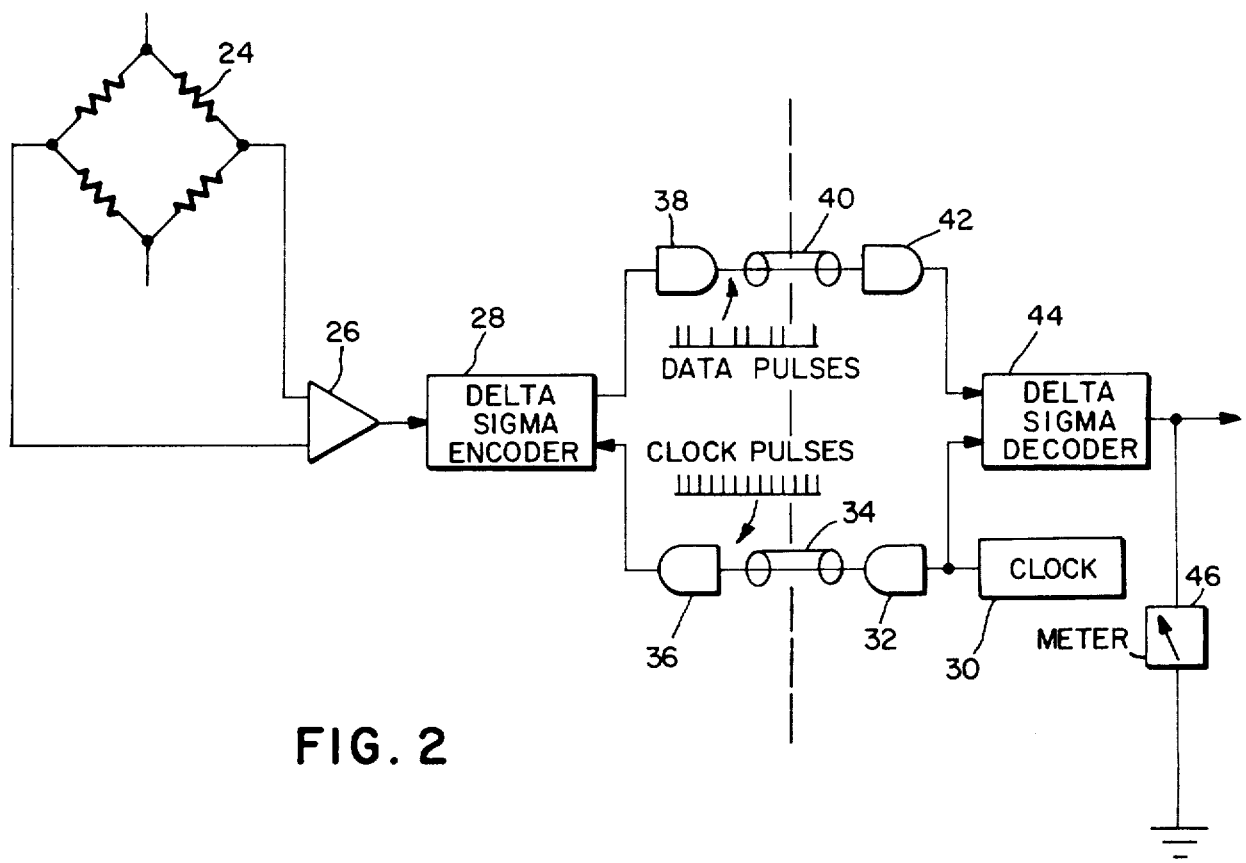
FIG. 2 is a block diagram illustrating the overall converter system structure.

In FIG. 2 there is shown a block diagram of a complete converter and decoder system in which the present invention finds application. In FIG. 2 a transducer 24 is shown to represent any form of analog signal generating device. The analog output is applied to an amplifier 26 for buffering and then to a delta-sigma converter or encoder 28 according to the present invention for the generation of a corresponding pulse rate output. The converter 28 responds to clock signals which for convenience are generated at the receiver or decoder portion of the structure by a clock 30 and applied through a line driver amplifier 32, transmission cable 34 and line receiver amplifier 36 to the converter 28. The converter 28 provides an output having a pulse rate corresponding to the analog input signal level, which is applied through a similar line driver 38, cable 40 and line receiver 42 to a delta-sigma decoder 44 according to the present invention. The corresponding analog output from the decoder 44 may be applied to a meter 46 or other utilization devices.

As may be appreciated from the FIG. 2 diagram, the present invention has particular utility in accurately transmitting information contained in an analog signal over great distances, as represented by the cables 34 and 40, by conversion to a pulse rate and subsequent decoding into the original analog signal level.

Figure 3:
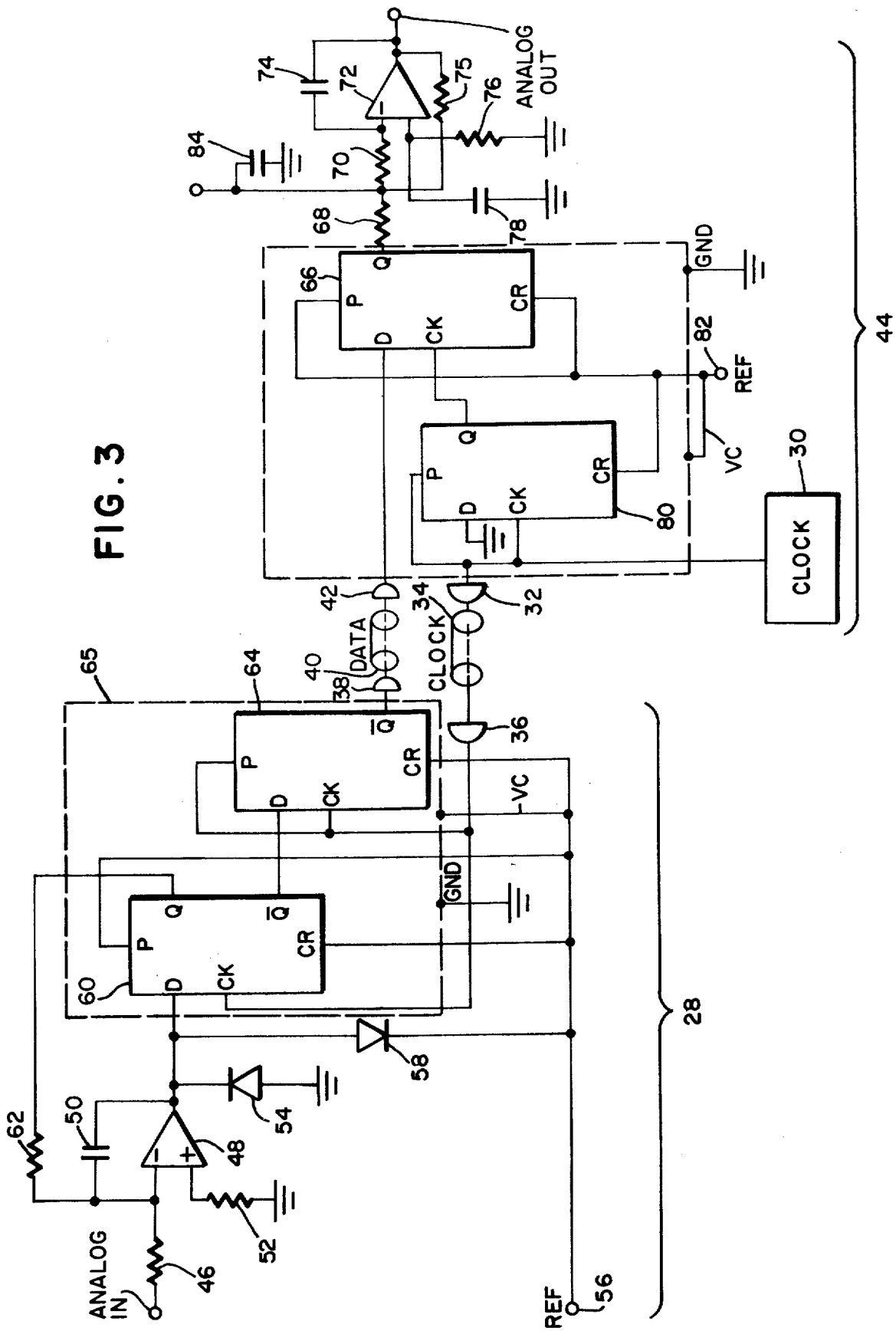
FIG. 3 is a detailed circuit diagram describing specifically the delta-sigma converter of the present invention.

The detailed constructions of the delta-sigma converter encoder 28 and decoder 44 are more fully shown in FIG. 3. As represented there, the analog input is applied through a resistor 46 to the inverting input of a differential operational amplifier 48 which has a capacitor 50 in a negative feedback loop from its output to the inverting input. The non-inverting input is connected to ground through a resistor 52 as a bias. The output of amplifier 48 is also clamped to ground through a diode 54, oriented in the reverse conduction direction to ground, and is also clamped to a reference level as applied to an input terminal 56 through a further diode 58 oriented in the forward conduction direction. This output is also applied to the D input of a D type flip-flop 60 having a high impedance C-MOS input. The Q output of the flip-flop 60 has a low impedance analog switch characteristic and is applied to the inverting input of the amplifier 48 through a resistor 62. Additionally, the P and CR terminals of the flip-flop 60 are connected to the reference terminal 56. The $\bar{Q}$ output of the flip-flop 60 is applied to the D input of a flip-flop 64. The CR terminal of the flip-flop 64 is also connected to the reference terminal 56. The clock pulses supplied through cable 34 and line receiver 36 are connected to the CK input of the flip-flop 60 and also to the P and CK inputs of flip-flop 64. The flip-flops 60 and 64 are supplied in a single integrated circuit package 65 having a ground connection and VC input connected to terminal 56.

The $\overline{Q}$ output of the flip-flop 64, which is a series of pulses occurring at a rate corresponding to the analog input signal applied to the amplifier 48, is applied through line driving amplifier 38 and receiving amplifier 42 and cable 40 to the decoder, and in particular to the D input of a flip-flop 66. The Q output of the flip-flop 66 is applied through series resistors 68 and 70 to the inverting input of an amplifier 72 which has a capacitor 74 connected in a negative feedback loop from the output of the inverting input. A resistor 75 is connected between the amplifier 72 output and the junction between resistors 68 and 70. The non-inverting input of the amplifier 72 is grounded through a parallel combination of a resistor 76 and a capacitor 78. The output of the amplifier 72 provides an analog reproduction of the analog input to the amplifier 48.

The signals from the clock 30 in the decoder 44, in addition to being applied through the cable 34, are connected to the P and CK inputs of a flip-flop 80 acting as an inverter. The D input of the flip-flop 80 is grounded and the Q output is applied to the CK input of flip-flop 66. A reference signal from a terminal 82 is applied to the CR inputs of the flip-flops 66 and 80 and to the P input of flip-flop 66. In constructing the circuit configuration for the decoder 44, the flip-flops 66 and 80 are also available in a single integrated circuit chip as a dual D flip-flop package. Model 74C74 manufactured by National Semiconductor, Inc. is an example. Additionally, the amplifiers 48 and 72 are available as a unitary integrated circuit.

As will be recognized by those skilled in the art, an input signal of a given signal level applied across the resistor 46 to the non-inverting input of the amplifier 48 will cause the amplifier, with the feedback capacitor 50, to integrate the level on a first slope at a rate representative of the input signal level. At a first threshold level, established by the high impedance C-MOS D input of flip-flop 60, the Q output will at the next clock pulse switch between the reference level and ground at a low impedance to act as an analogous switch. That output is applied to the inverting input of amplifier 48 through the resistor 62, causing the overall operation of amplifier 48 to integrate on an opposite slope typically more rapidly. This new slope will rapidly cause the flip-flop 60 to see at its input a signal below the logic threshold and will accordingly cause the flip-flop 60 upon the next clock pulse to again switch the signal of the Q output, permitting integration on the first slope. It can now be seen that the process will repeat itself indefinitely and that the flip-flop 60 will switch states at its Q output at a rate dependent upon the level of the analog input signal. The flip-flop 60 acts an an analog switch for the relatively well-regulated reference signal at terminal 56 to maintain conversion accuracy. In addition, the D input of the flip-flop type employed herein having a particularly high C-MOS input impedance permits the D input of the flip-flops 60 to act as a comparator.

The $\overline{Q}$ output from the flip-flop 60 is applied to the flip-flop 64 for pulse-shaping and inversion. The P terminal of the flip-flop 60 receives the reference signal from terminal 56 in order to enable the flip-flops 60 to operate without a P inhibition. The P input to the flip-flop 64 is connected to the clock signal line in order to insure an off condition at the Q output at all times, except during a clock interval in order to provide the pulse-shaping function.

The flip-flops 66 and 80 act as pulse-shaping circuits, while the amplifier 72 and its associated circuitry acts as an active filter which provides an average DC output. The level of the analog output from amplifier 72 will thus be proportional to the number of pulses received at its inverting input per unit time or upon pulse rate as is the desired result. An optional capacitor 84 adds a pole to the filter transform to provide improved response.

It can be seen that a complete analog data transmission system employing conversion to pulse rate and decoding to analog signal level can be based upon a simple combination of a dual flip-flop integrated circuit package commonly available in combination with a readily available operational amplifier circuit. Specific interconnections and the addition of a few discrete components determine whether it operates to encode or decode and in either case provides for extreme simplicity in manufacture and corresponding cost reduction.

Modifications to the disclosed circuit can be made within the teaching of the invention without departing from its spirit. Accordingly, it is intended to limit the scope of the invention only as indicated in the following claims.

What is claimed is:

1. A converter for transforming an analog signal level into a pulse rate comprising:
    means for integrating said analog signal level in combination with a signal on a terminal to provide an integration signal;
    means for providing a clock signal;
    a reference signal source;
    a first digital register directly responsive to said clock signal and the integration signal to switch the reference signal to said terminal or not according to the level of the integration signal with respect to a threshold level;
    said threshold level being defined by said digital register at the integration signal input thereof;
    said reference signal being of a polarity to cause said integrator to integrate on opposite sign slopes in response to the reference signal being switched or not to said terminal; and
    a second digital register operative in association with said first digital register and responsive to said clock signal for providing an output pulse coincident with each clock signal and a set level of said switched reference signal; and
    wherein said first and second registers are D flip-flops provided as a dual integrated circuit package.

2. A converter for transforming an input analog signal level into a pulse rate comprising:
    means for integrating said analog signal level in combination with a feedback signal to provide an integrator output signal;
    means for providing a clock signal;
    a first bistable storage means including an input characterized by a threshold level, an output, and a clock signal input, the output signal therefrom having two levels and being representative of the magnitude of a signal applied to the input relative to the threshold level at the last occurrence of said clock signal;

said integrator output signal being applied to the storage means input;

said output signal from said first storage means providing the feedback signal of a polarity to cause said integrator to integrate on opposite signs slope upon the occurrence of one of the output levels from said bistable storage means; and a second bistable storage means operative in association with said first storage means and responsive to said clock signal for providing an output pulse coincident with each clock signal and corresponding to the output level from said first storage means at the time of each clock signal.

3. The converter of claim 2 wherein said first storing means has a high impedance input.

4. The converter of claim 3 wherein said high impedance input is a C-MOS input.

5. The converter of claim 2 wherein said first storing means has a low impedance output providing said switched reference signal.

6. The converter of claim 2 further including:

means responsive to the output pulses and said clock signal for providing an analog output signal representative of the average DC level of the output pulses.

7. The converter of claim 6 wherein said means for providing an analog output further includes:

means for pulse-shaping the output pulses; and means for filtering the pulse-shaped output of said first register element with a loss characteristic to provide an analog output level corresponding to the rate of output pulses applied thereto.

* * * * *